United States Patent [19]
Cheek et al.

[11] Patent Number: 5,970,349
[45] Date of Patent: Oct. 19, 1999

[54] SEMICONDUCTOR DEVICE HAVING ONE OR MORE ASYMMETRIC BACKGROUND DOPANT REGIONS AND METHOD OF MANUFACTURE THEREOF

[75] Inventors: Jon Cheek, Round Rock; Mark I. Gardner, Cedar Creek; Michael Duane, Austin, all of Tex.

[73] Assignee: Advanced Micro Devices, Austin, Tex.

[21] Appl. No.: 09/139,179

[22] Filed: Aug. 24, 1998

[51] Int. Cl.[6] .......................... H01L 29/78; H01L 21/266
[52] U.S. Cl. .............................. 438/286; 438/289
[58] Field of Search ..................... 438/174, 194, 438/199, 200, 217, 301, 305, 345, 286, 289, 290, 291

[56] References Cited

U.S. PATENT DOCUMENTS

| | | |
|---|---|---|
| 3,936,857 | 2/1976 | Ota ............................................. 357/23 |
| 4,011,105 | 3/1977 | Paivinen et al. ......................... 148/1.5 |
| 4,541,166 | 9/1985 | Yamazaki .................................. 29/571 |
| 5,578,509 | 11/1996 | Fujita ......................................... 437/35 |
| 5,691,213 | 11/1997 | Chang et al. ............................. 437/27 |
| 5,830,788 | 11/1998 | Hiroki et al. ........................... 438/199 |

*Primary Examiner*—Olik Chaudhuri
*Assistant Examiner*—Daniel H. Mao
*Attorney, Agent, or Firm*—Merchant & Gould P.C.

[57] ABSTRACT

Semiconductor devices having one or more asymmetric background dopant regions and methods of fabrication thereof are provided. The asymmetric background dopant regions may be formed using a patterned mask with wider openings than conventional masks while substantially maintaining device performance. This can, for example, facilitate the fabrication process and allow greater flexibility in the choice of photolithography tools.

21 Claims, 3 Drawing Sheets

SEMICONDUCTOR DEVICE HAVING ONE OR MORE ASYMMETRIC BACKGROUND DOPANT REGIONS AND METHOD OF MANUFACTURE THEREOF

FIELD OF THE INVENTION

The present invention is directed generally to semiconductor devices and methods of manufacture thereof and, more particularly, to semiconductor devices having one or more asymmetric background dopant regions.

BACKGROUND OF THE INVENTION

Over the last few decades, the electronics industry has undergone a revolution by the use of semiconductor technology to fabricate small, highly integrated electronic devices. The most common and important semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103 acts as a conductor. An input signal is typically applied to the gate electrode 103 via a gate terminal (not shown). Heavily doped source/drain regions 105 are formed in the semiconductor substrate 101 and are connected to source/drain terminals (not shown). As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to an active region used for the formation of a source or drain.

A channel region 107 is formed in the semiconductor substrate 101 beneath the gate electrode 103 and separates the source/drain regions 105. The channel is typically lightly doped with a dopant type op site to that of the source/drain regions 105. The gate electrode 103 is generally separated from the semiconductor substrate 101 by an insulating layer 109, typically an oxide layer such as SiO2. The insulating layer 109 is provided to prevent current from flowing between the gate electrode 103 and the source/drain regions 105 or channel region 107.

In operation, an output voltage is typically developed between the source and drain terminals. When an input voltage, which exceeds a threshold voltage $V_T$, is applied to the gate electrode 103, a transverse electric field is set up in the channel region 107. By varying the transverse electric field, it is possible to modulate the conductance of the channel region 107 between the source region and the drain region. In this manner an electric field controls the current flow through the channel region 107. This type of device is commonly referred to as a MOS field-effect-transistors (MOSFET).

A voltage threshold region 111 is typically formed at the substrate surface within the channel region 107. The voltage threshold region 111 is used to adjust the threshold voltage of the device and may be a p-type or n-type doped region depending on the desired shift in the threshold voltage. A punchthrough region 113 having a depth near the bottom of the source/drain regions 105 is also formed in the semiconductor substrate 101 beneath the channel region 107. The punchthrough region 113 is more highly doped than the substrate 101 with a similar dopant type and serves to suppress deleterious currents which flow in the device when the input voltage is below the threshold voltage.

While these background dopant regions can increase device performance, care must be taken in their formation so that other device characteristics are not detrimentally impacted. The punchthrough region 113, for example, increases the substrate doping and thereby increases source-to-body and drain-to-body junction capacitances and reduces the breakdown voltages of the source/drain junctions. To avoid these drawbacks, conventional fabrication techniques typically selectively implant the voltage threshold region 111 and punchthrough region 113 only in or beneath the channel region 107.

A typical conventional process flow is illustrated in FIGS. 2A–2B. In this process, field regions 203 are formed in a substrate 201 to define an active region 205 therebetween. A patterned mask 207 is then formed over the substrate 201 having an opening 209 exposing a future channel region of the active region 205. To ensure implantation into the channel region, the mask opening 209 typically has a width equivalent to the width of a future gate electrode 211 (shown in dashed lines) with some margin for error. Background dopants are then implanted into the substrate 201 to form a voltage threshold region 213 and a punchthrough region 215. The resultant structure is illustrated in FIG. 2A. Fabrication then continues with the formation of the gate electrode 217 and source/drain regions 219, as illustrated in FIG. 2B.

Large numbers of such semiconductor devices are used as basic building blocks for most modern electronic devices. In order to increase the capability and performance of electronic devices implemented using semiconductor devices, it is desirable to increase the number of semiconductor devices which may be formed on a given surface area of a chip wafer. To accomplish these goals, it is desirable to reduce the size of the semiconductor devices without degrading their performance. New semiconductor fabrication processes and devices are therefore needed to continue the trend of reduced semiconductor device size and increased performance.

SUMMARY OF THE INVENTION

Generally, the present invention relates semiconductor devices having one or more asymmetric background dopant regions and method of fabrication. The asymmetric background dopant regions may be formed using a patterned mask with wider openings than conventional masks without substantially degrading device performance. This can, for example, facilitate the fabrication process and allow greater flexibility in the choice of photolithography tools.

In one embodiment, a fabrication process is provided which includes defining an active region including a channel region area and first and second source/drain region areas in a substrate. Forming a patterned mask with an opening exposing the channel region area and a greater portion of the first source/drain region area and the second source/drain region area. With the mask in place, one or more background dopants (e.g., punchthrough dopants and/or voltage threshold dopants) are implanted into the selectively masked active region to form one or more background dopant regions within the substrate that extend further into the first source/drain region area then the second source/drain region area. First and second source/drain regions are then formed in the first and second source/drain region areas respectively with the first source/drain region being coupled to a lower voltage source.

A semiconductor device, in accordance with an embodiment of the invention, includes a substrate and first and second source/drain regions disposed in the substrate. The first source/drain region is coupled to a relatively low voltage and the second source/drain is coupled to a relatively high voltage. The device further includes one or more background dopant regions (e.g., punchthrough region and/or a voltage threshold region) disposed in the substrate and extending further into the first source/drain region than the second source/drain region.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
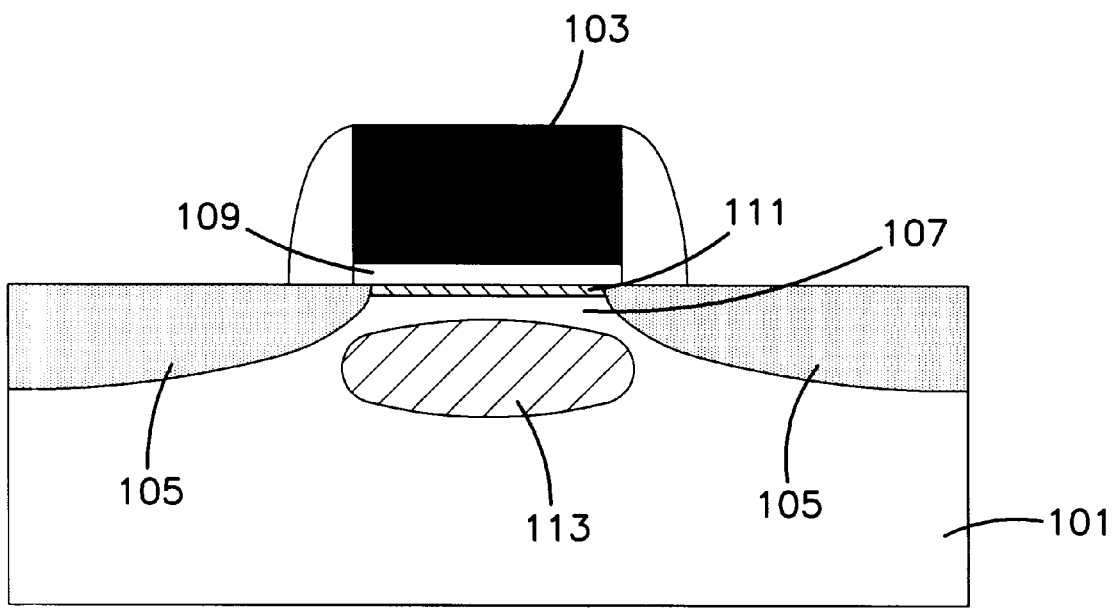
FIG. 1 illustrates components of a typical MOS device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention will be applicable to a number of semiconductor devices. The present invention is believed to be particularly suited to MOS semiconductor devices (e.g., NMOS, PMOS, CMOS and BiCMOS devices) which utilize background dopants in active regions. While the present invention is not limited to such devices, an appreciation of various aspects of the invention will be gained through a discussion of various fabrication processes and device characteristics in connection with the examples provided below.

Figure 2A:
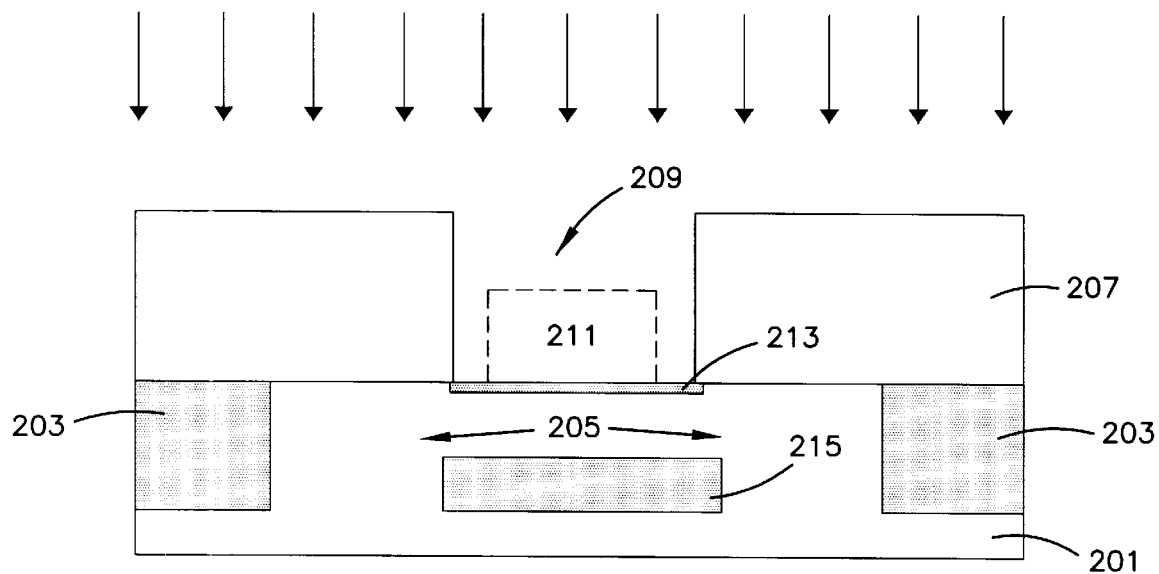
FIGS. 2A–2B illustrates a typically fabrication process for a MOS device.
Figure 2B:
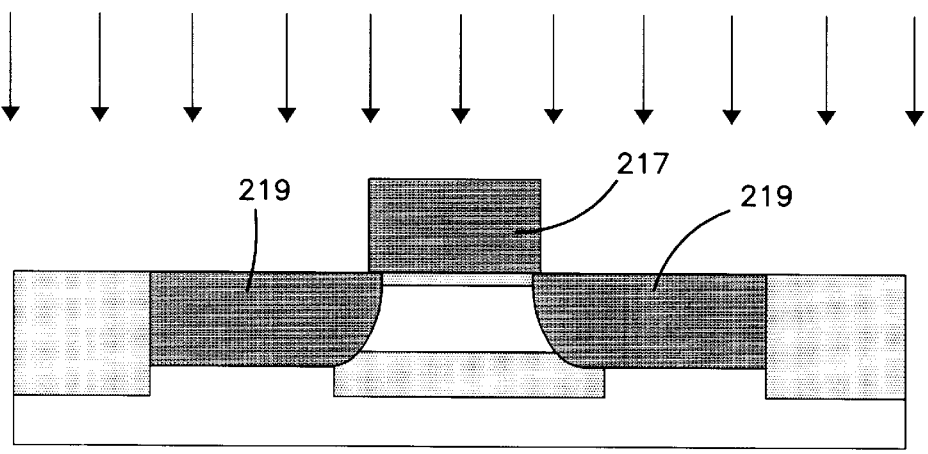

As semiconductor devices are scaled down, the features of the devices must be made smaller. The formation of background dopant regions is particularly illustrative. As the gate electrode width is reduced, the opening 209 (FIG. 2A) used to implant background dopants must be reduced. The fabrication of smaller openings requires the use of newer and more expensive photolithography tools. The smaller openings also reduce the margins for error. The present invention, in one aspect, overcomes these deficiencies by forming asymmetric background dopant regions which exploit the physics of the device to maintain adequate reliability and can be formed using a larger mask openings than conventional techniques. The larger mask openings, in turn, allow for greater flexibility in the choice of photolithography tools.

Figure 3A:
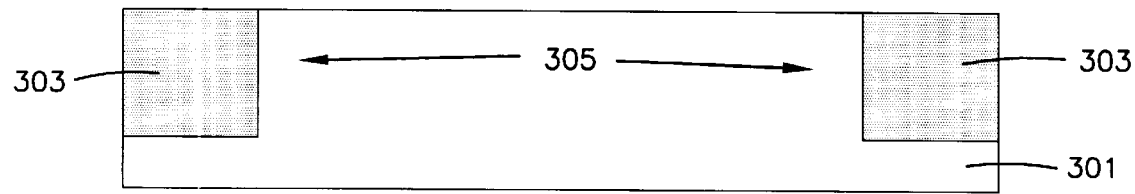
FIGS. 3A–3C illustrate an exemplary fabrication process in accordance with an embodiment of the invention.
Figure 3B:
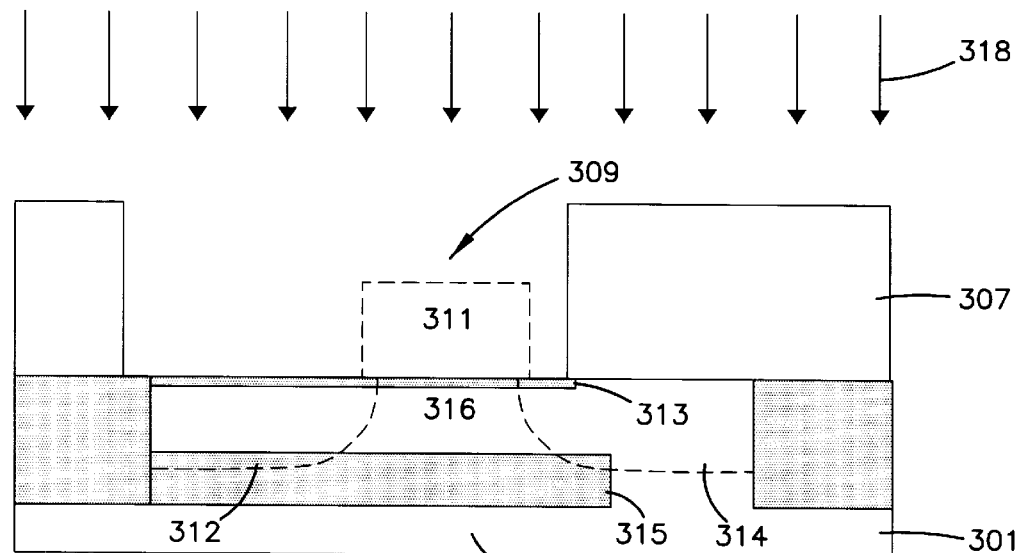
Figure 3C:
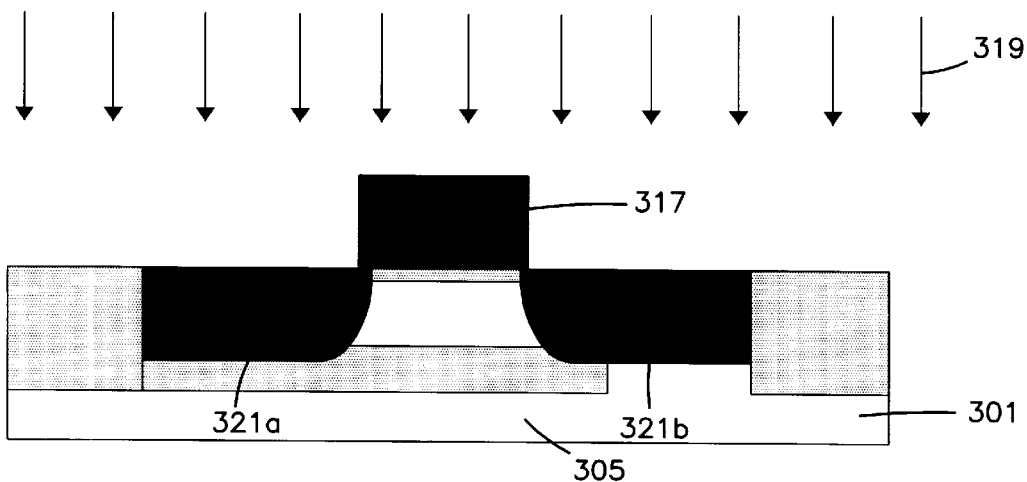

FIGS. 3A–3C illustrate an exemplary process for fabricating a semiconductor device having one or more asymmetric background dopant regions. It should be appreciated that the general features of the example fabrication process illustrated in FIGS. 3A–3C could be used to fabricate a number of different types of semiconductor devices. Moreover, the number of devices used and overall configuration of devices formed could be modified in consideration of the circuit to be formed without departing from the invention. To facilitate explanation, an example of a process used to form both a threshold voltage region and a punchthrough region is described.

In this illustrative process, an active region 305 is defined in a substrate 301. The active region 305 is a region of the substrate 301 in which a transistor having source/drain regions and a gate electrode will be formed. The substrate 301 is typically a lightly-doped silicon substrate. The type (e.g., n-type or p-type) of the substrate 301 is typically dictated by the type of device being formed. For example, for n-type MOS (NMOS) devices, the substrate 301 is typically formed from a lightly-doped p-type substrate, while for p-type MOS (PMOS) devices, the substrate is typically a lightly-doped n-type substrate. In some cases, the substrate 301 may be a well of a certain type within a substrate body of a different type. The active region 305 may lie between two field regions 303 formed in a substrate 301. The field regions 303 are typically formed from an oxide, such as silicon dioxide, using well known techniques. Alternatively, a plurality of active regions may be formed between the field regions 303, with the active region 305 being one of them.

A patterned mask 307 is formed over the substrate 301 to asymmetrically expose the active region 305. The mask 307 is typically formed using well known photolithography techniques. These techniques typically include forming a masking layer, such as a photoresist, over the substrate, exposing the masking layer to radiation, and developing the exposed masking layer to form a pattern therein. The mask 307 generally includes a relatively large and asymmetric opening 309. The opening 309 generally exposes a future channel region 316 and a greater portion of a future source/drain region 312 (shown dashed) than the other future source/drain region 314 (shown dashed). The opening 309 may, for example, extend from just beyond one edge of a future gate electrode 311 (shown dashed) to the end or beyond the exposed future source/drain region 312. The width of the opening 309 can vary depending on the width of the gate electrode, any overlap error, as well as the amount of the exposed source/drain region 312. The width of the gate electrode can, for example, range from about 0.1 to 0.35 microns. Moreover, as semiconductor devices continue to scale down, the width of the gate electrode will scale down as well.

With the mask 307 in place, one or more background dopants 318 are implanted into the substrate 301 to form one or more asymmetric (relative to the channel) background dopant regions within the substrate 301. In the illustrated embodiment, a background dopant is implanted into the exposed portion of the substrate 301 to form a voltage threshold region 313 at the surface of the substrate 301. Another background dopant is implanted into the substrate 301 to form a punchthrough region 315 deeper within the substrate 301. Typically, the punchthrough region 315 has a peak concentration which lies near the bottom of the source/drain regions. In other embodiments, only a punchthrough implant or a voltage threshold implant may be performed. The conductivity type of the voltage threshold dopant can vary depending on the desired shift in the threshold voltage. For many application, suitable implant energies and dopant dosages for the voltage threshold implant range from 5 to 20 kev and 1E12 ($1\times10^{12}$) to 2E13 ($2\times10^{13}$) ions/cm$^2$, respectively. The punchthrough implant dopant is typically of the same conductivity type of the substrate 301. Depending on the type of dopant suitable implant energies and dopant dosages for the punchthrough implant range from 50 to 100 kev and 1E12 to 2E13 ions/cm$^2$, respectively. The resultant structure is illustrated in FIG. 3B.

The mask 307 is then removed and a gate electrode 317 is formed in the active region 305 over the substrate 301. The gate electrode 317 is typically separated from the substrate 301 by a gate insulating layer (not shown). The gate electrode structure illustrated in FIG. 3C may be formed using a number of different well-known techniques. Using the gate electrode 317 for alignment, dopants 319 are then implanted into the substrate 301 to form source/drain regions 321a and 321b in the active region 305. The conductivity type of the dopant 319 depends on the type of device device being formed. For example, with NMOS devices, n-type dopants such as arsenic or phosphorus are implanted. In PMOS devices, p-type dopants such as boron are typically implanted. It should be appreciated, the implant energies and dopant dosages for the dopant implant can vary depending on the type of dopant.

The resultant structure, depicted in FIG. 3C, includes first and second source/drain regions 321a and 321b disposed in the substrate 301 and voltage threshold and punchthrough regions disposed in the substrate 301 and extending further into the first source/drain region 321a than the second source/drain region 321b. The substrate 301 is typically coupled to a low voltage source, such as ground. The first source/drain region 321a is typically coupled, directly or indirectly, to a relatively low voltage, such as ground, while the other source/drain region 321b is typically coupled to a higher voltage. In a NMOS device, for example, the first source/drain region 321a is typically used as a source. In a PMOS device, the first source/drain region 321a is typically used as the drain.

These electrical connection techniques exploit the device physics to maintain device reliability and performance despite the background dopant region(s) presence in or near one source/drain region. For instance, since this electrical coupling does not reverse bias the first source/drain region 321a, the background dopant region(s) presence in or near the first source/drain region 321a produces negligible junction capacitance between the substrate 301 and the first source/drain region 321a. On the other hand, the junction capacitance of the reverse-biased source/drain region 321b is minimized due to the minimal background dopant intrusion in or near this area.

Using the above process, background dopant regions which are asymmetric about the channel region can be formed and greater fabrication flexibility can be achieved. The above process, in particular, provides larger openings for background dopant implants thus allowing more flexibility in the choice of photolithography tools. At the same time, capacitance characteristics of source/drain regions can be exploited to minimize junction capacitances despite the extension of the background dopant region(s) on one side of the channel.

As noted above, the present invention is applicable to the fabrication of a number of different devices exploiting such features. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

What is claimed is:

1. A process of fabricating a semiconductor device, comprising:
    defining an active region including a channel region area and first and second source/drain region areas in a substrate;
    forming a patterned mask over the active region to expose the channel region area and a greater portion of the first source/drain region area than the second source/drain region area;
    implanting one or more background dopants into the masked active region to form one or more background dopant regions within the substrate that extend further into the first source/drain region area than the second source/drain region area;
    forming a gate electrode over the substrate after forming the patterned mask and implanting the one or more background dopants; and
    forming first and second source/drain regions in the first and second source/drain region areas respectively.

2. The process of claim 1, wherein forming the gate electrode comprises forming the gate electrode over the substrate after forming the patterned mask and implanting the one or more background dopants and prior to forming the first and second source/drain regions.

3. The process of claim 2, wherein forming the first and second source/drain regions includes implanting a dopant into the substrate using the gate electrode as a mask.

4. The process of claim 1, wherein defining the active region includes forming field regions within the substrate, the active region being defined between the field regions.

5. The process of claim 1, wherein forming the patterned mask includes forming an opening in the mask which exposes the entire first source/drain region area.

6. The process of claim 1, further including coupling the first source/drain region to a relatively low voltage and coupling the second source/drain region to a relatively high voltage.

7. The process of claim 1, wherein the semiconductor device is an n-type device and the first source/drain region is used as a source.

8. The process of claim 1, wherein the semiconductor device is a p-type device and the first source/drain region is used as a drain.

9. The process of claim 1, wherein implanting one or more background dopants comprises implanting a voltage threshold dopant into the masked active region to form a voltage threshold region that extends further into the first source/drain region than into the second source/drain region.

10. The process of claim 9, wherein implanting one or more background dopants further comprises implanting a punchthrough dopant into the masked active region to form a punchthrough region that extends further into the first source/drain region than into the second source/drain region.

11. The process of claim 1, wherein implanting one or more background dopants comprises implanting a punchthrough dopant into the masked active region to form a punchthrough region that extends further into the first source/drain region than into the second source/drain region.

12. The process of claim 1, further comprising removing the patterned mask prior to forming the first and second source/drain regions.

13. The process of claim 1, wherein the background dopants are n-type and the first and second source/drain regions are formed using p-type dopant.

14. The process of claim 1, wherein the background dopants are p-type and the first and second source/drain regions are formed using n-type dopant.

15. The process of claim 1, wherein forming the patterned mask comprises forming the patterned mask over the active region to expose the channel region area, a portion of the first source/drain region area adjacent to the channel region area, and a portion to the second source/drain region area adjacent to the channel region area, wherein the exposed portion of the first source/drain region area is larger than the exposed portion of the second source/drain region area.

16. The process of claim 1, wherein forming the patterned mask comprises forming the patterned mask over the active region to expose all of the first source/drain region area and channel region area and at least a portion of the second source/drain region area adjacent to the channel region area.

17. A process of fabricating a semiconductor device, comprising:

defining an active region including a channel region area and first and second source/drain region areas in a substrate;

forming a patterned mask over the active region to expose the channel region area, a portion of the first source/drain region area adjacent to the channel region area, and a portion of the second source/drain region area adjacent to the channel region area, wherein the exposed portion of the first source/drain region area is larger than the exposed portion of the second source/drain region area;

implanting one or more background dopants into the masked active region to form one or more background dopant regions within the substrate that extend further into the first source/drain region area than the second source/drain region area; and forming first and second source/drain regions in the first and second source/drain region areas respectively.

18. The process of claim 17, wherein forming the patterned mask comprises forming the patterned mask over the active region to expose all of the first source/drain region area and channel region area and at least a portion of the second source/drain region area adjacent to the channel region area.

19. A process of fabricating a semiconductor device, comprising:

defining an active region including a channel region area and first and second source/drain region areas in a substrate;

forming a patterned mask over the active region to expose the channel region area and a greater portion of the first source/drain region area than the second source/drain region area;

implanting one or more background dopants into the masked active region to form one or more background dopant regions within the substrate, wherein the one or more background dopant regions extend from at least the first source/drain region area to the second source/drain region area; and forming first and second source/drain regions in the first and second source/drain region areas respectively.

20. The method of claim 19, wherein implanting one or more background dopants comprises implanting a voltage threshold dopant into the masked active region to form a voltage threshold region that extends from at least the first source/drain region area to the second source/drain region area.

21. The method of claim 19, wherein implanting one or more background dopants comprises implanting a punchthrough dopant into the masked active region to form a punchthrough region that extends from at least the first source/drain region area to the second source/drain region area.

* * * * *